(12) United States Patent
Hayashi (10) Patent No.: US 6,905,948 B2
(45) Date of Patent: Jun. 14, 2005

(54) METHOD FOR MANUFACTURING SEMICONDUCTOR DEVICE

(75) Inventor: Masahiro Hayashi, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/394,448

(22) Filed: Mar. 21, 2003

(65) Prior Publication Data

US 2004/0002201 A1 Jan. 1, 2004

(30) Foreign Application Priority Data

Mar. 26, 2002 (JP) ........................ 2002-085575

(51) Int. Cl.⁷ ................ H01L 21/425; H01L 21/20
(52) U.S. Cl. ...................... 438/527; 438/506
(58) Field of Search ................ 438/527, 524, 438/519, 506, 276, 275, 268, 257, 525, 273, 231, 228, 217, 199, 154, 79

(56) References Cited

U.S. PATENT DOCUMENTS 5,576,570 A * 11/1996 Ohsawa et al. ............. 257/369
6,368,914 B1 * 4/2002 Kim et al. .................. 438/257

FOREIGN PATENT DOCUMENTS

| JP | 01-268171 | 10/1989 |
|---|---|---|
| JP | 07-078881 | 3/1995 |
| JP | 08-274268 | 10/1996 |
| JP | 2000-286346 | 10/2000 |
| JP | 2000-294742 | 10/2000 |
| JP | 2001-291678 | 10/2001 |
| JP | 2001-291679 | 10/2001 |
| JP | 2001-291786 | 10/2001 |

* cited by examiner

Primary Examiner—Craig A. Thompson
Assistant Examiner—Monica D Harrison
(74) Attorney, Agent, or Firm—Harness, Dickey & Pierce, P.L.C.

(57) ABSTRACT

A method is provided for manufacturing a semiconductor device having a high breakdown voltage transistor and a low breakdown voltage transistor with different driving voltages provided in a common layer. The method includes: (a) implanting an impurity of a second conductivity type in a specified region of a semiconductor layer of a first conductivity type to form a first well; (b) implanting an impurity of the second conductivity type in a specified region of the semiconductor layer to form a second well having an impurity concentration different from the first well; and (c) implanting an impurity of the first conductivity type in a specified region of the first well to form a third well.

6 Claims, 13 Drawing Sheets

METHOD FOR MANUFACTURING SEMICONDUCTOR DEVICE

TECHNICAL FIELD

The present invention relates to a method for manufacturing a semiconductor device having a high breakdown voltage transistor and a low breakdown voltage transistor in a common semiconductor layer.

BACKGROUND

A liquid crystal panel driver LSI and a CCD driver LSI, for example, are operated at a power supply voltage of 10V or higher, and therefore high breakdown voltage transistors having a breakdown voltage of 20V or higher are normally required. On the other hand, low breakdown voltage transistors are used in internal control logic sections that need to be small in size and operated at high speeds. The wells where high breakdown voltage transistors are formed tend to be made deeper, and their surface impurity concentration are decreased, in order to secure the well breakdown voltage. In contrast, wells where low breakdown voltage transistors are formed tend to be made shallower, and their surface impurity concentration are increased, in order to reduce the element size and to achieve higher speeds. For this reason, high breakdown voltage transistors are formed in a separate chip that is different from the chip used for low breakdown voltage transistors, and are generally formed as an externally mounted circuit.

An object of the present invention is to provide a method for manufacturing a semiconductor device having a high breakdown voltage transistor and a low breakdown voltage transistor with different driving voltages provided in a common layer.

SUMMARY

A method for manufacturing a semiconductor device in accordance with the present invention includes:

implanting an impurity of a second conductivity type in a specified region of a semiconductor layer of a first conductivity type to form a first well;

implanting an impurity of the second conductivity type in a specified region of the semiconductor layer to form a second well having an impurity concentration different from the first well; and implanting an impurity of the first conductivity type in a specified region of the first well to form a third well.

By the manufacturing method in accordance with the present invention, a plurality of wells having different impurity concentrations are formed through at least different ion implanting steps, such that each of the wells can be independently designed. As a result, the design of each of the wells can be optimized for transistors to be formed therein. For example, wells where high breakdown voltage transistors are formed can surely have a sufficient breakdown voltage. Also, wells where low breakdown voltage transistors are formed can be made shallow to accommodate size-reduction and the higher speed of low breakdown voltage transistors, and also can reduce the areas of the wells accordingly, such that the degree of integration of low breakdown voltage transistors can be increased.

The manufacturing method of the present invention can assume a variety of embodiments as follows.

(A) An impurity concentration of the second well can be made higher than an impurity concentration of the first well. In this case, low breakdown voltage transistors can be formed in the second well, and high breakdown voltage transistors can be formed in the first well.

In accordance with this embodiment, for example, a low breakdown voltage transistor of the first conductivity type may be formed in the second well, a low breakdown voltage transistor of the second conductivity type may be formed in the third well, and a high breakdown voltage transistor of the first conductivity type may be formed in the first well.

(B) An impurity concentration of the second well can be made lower than an impurity concentration of the first well. In this case, high breakdown voltage transistors can be formed in the second well, and low breakdown voltage transistors can be formed in the first well.

In accordance with this embodiment, for example, a low breakdown voltage transistor of the first conductivity type may be formed in the first well, a low breakdown voltage transistor of the second conductivity type may be formed in the third well, and a high breakdown voltage transistor of the first conductivity type may be formed in the second well.

(C) An impurity of the second conductivity type may be implanted in a specified region of the semiconductor layer to form a fourth well having an impurity concentration different from those of the first well and the second well. In this case, a desired transistor can be formed in the fourth well, which improves the degree of design freedom.

In accordance with this embodiment, for example, a low breakdown voltage transistor of the second conductivity type may be formed in the third well, a low breakdown voltage transistor of the first conductivity type may be formed in the fourth well, and a low breakdown voltage transistor or a high breakdown voltage transistor of the first conductivity type may be formed in the first well.

DETAILED DESCRIPTION

An embodiment of the present invention will be described below with reference to the accompanying drawings.

1. First Embodiment

FIGS. 1–4 schematically show cross-sectional views concerning a method for manufacturing a semiconductor device in accordance with a first embodiment of the present invention.

Figure 1:
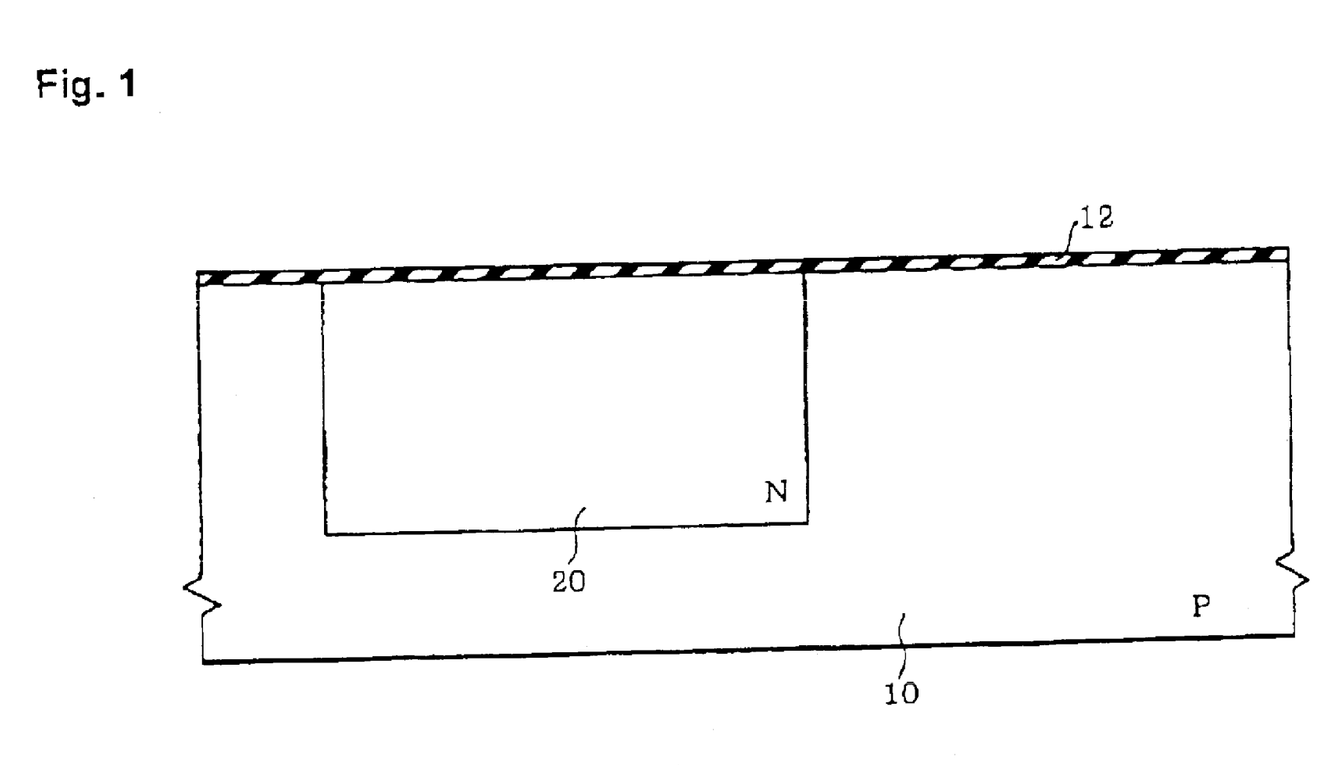
FIG. 1 shows a cross-sectional view indicating a method for manufacturing a semiconductor device in the process order in accordance with a first embodiment of the present invention.

(A) As shown in FIG. 1, a semiconductor layer 10 (e.g., of silicon) of a first conductivity type (P-type in this example) is thermally oxidized to form a silicon oxide layer 12 having a thickness of about 40 nm on a surface of the semiconductor layer 10. Then, a resist layer (not shown) is formed on the silicon oxide layer 12. The resist layer is patterned such that an opening section is formed therein at a position corresponding to an N-type first well. Then, for example, phosphorus ions are implanted in the semiconductor layer 10 using the resist layer as a mask to form an impurity layer (not shown) of a second conductivity type (N-type in this example). In this instance, phosphorus ions can be implanted at an acceleration voltage of 120 keV, for example.

Then, the impurity in the N-type first impurity layer is diffused (driven in) by a thermal treatment, to form an N-type first well 20.

Figure 2:
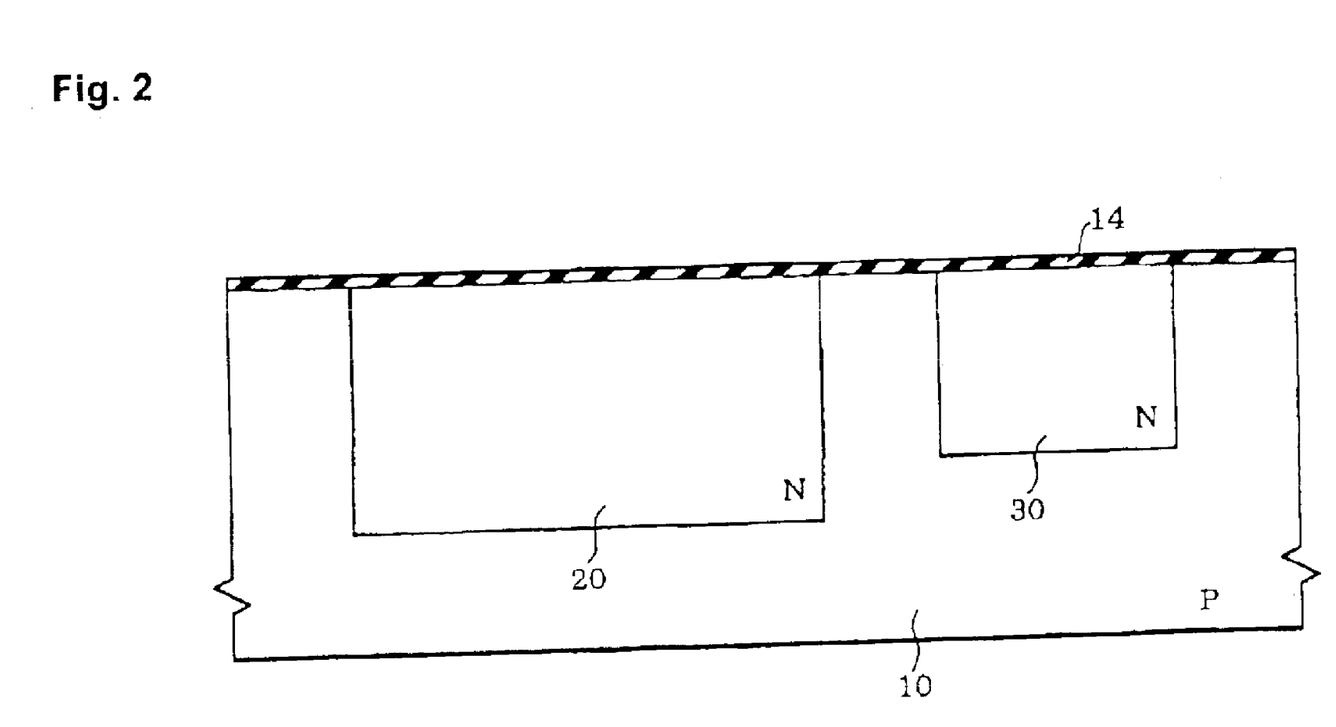
FIG. 2 shows a cross-sectional view indicating the method for manufacturing a semiconductor device in the process order in accordance with the first embodiment of the present invention.

(B) As shown in FIG. 2, after removing the silicon oxide layer 12 that has become thick by the heat treatment, the semiconductor layer 10 is thermally oxidized to form a silicon oxide layer 14 having a thickness of about 40 nm on a surface of the semiconductor layer 10. Then, a resist layer (not shown) is formed on the silicon oxide layer 14. The resist layer is patterned such that an opening section is formed therein at a position corresponding to an N-type second well. Then, for example, phosphorus ions are implanted in the semiconductor layer 10 using the resist layer as a mask to form an N-type impurity layer (not shown). In this instance, phosphorus ions can be implanted at an acceleration voltage of 60 keV, for example.

Then, the impurity in the N-type first impurity layer is diffused (driven in) by a thermal treatment, to form an N-type second well 30.

Here, the impurity concentration of the first well 20 formed in step (A) is set lower than the impurity concentration of the second well 30 formed in step (B). This aspect will be described in detail later.

It is noted that an earlier formed well is influenced by the drive-in step performed on a later formed well, and thus becomes deep. In this connection, the first well 20 is formed deep with a low impurity concentration, and then the second well 30 is formed shallow with an impurity concentration higher than that of the first well.

Figure 3:
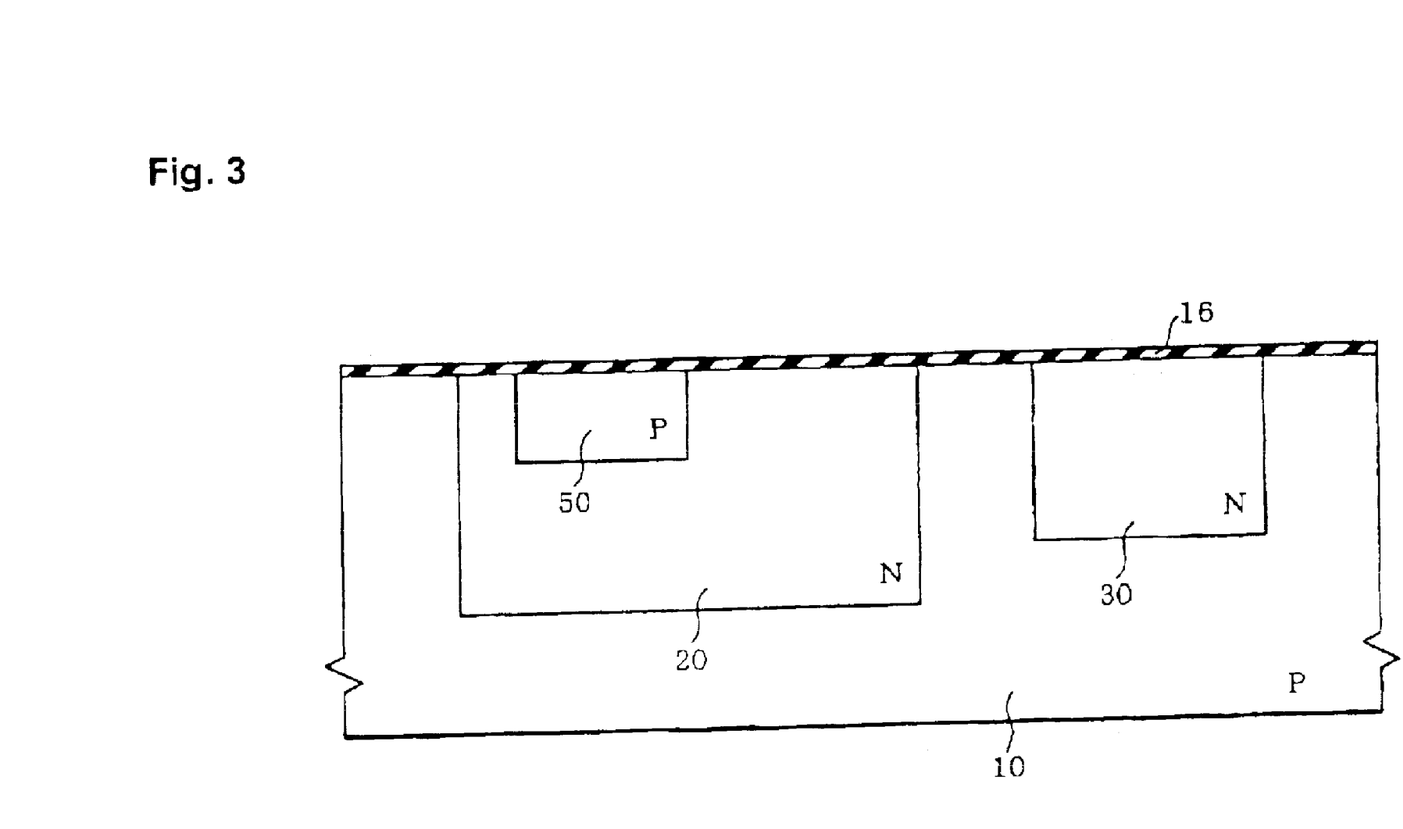
FIG. 3 shows a cross-sectional view indicating the method for manufacturing a semiconductor device in the process order in accordance with the first embodiment of the present invention.

(C) As shown in FIG. 3, after removing the silicon oxide layer 14 that has become thick due to the heat treatment, the semiconductor layer 10 is thermally oxidized to form a silicon oxide layer 16 having a thickness of about 40 nm on a surface of the semiconductor layer 10. A resist layer (not shown) having an opening section at a location corresponding to a third well is formed on the silicon oxide layer 16. Boron ions, for example, are implanted in a specified region of the N-type first well 20 using the resist layer as a mask, to form a P-type impurity layer. In this instance, boron ions can be implanted at an acceleration voltage of 60 keV, for example. Then, the impurity in the P-type impurity layer is diffused (driven in) by a thermal treatment, to form a P-type third well 50. At this time, impurities of the first well 20 and the second well 30 are also simultaneously diffused.

In this manner, the N-type first well 20, and the N-type second well 30 having an impurity concentration higher than that of the first well 20 are formed in the P-type semiconductor layer 10. Further, the P-type third well 50 is formed within the first well 20.

Figure 4:
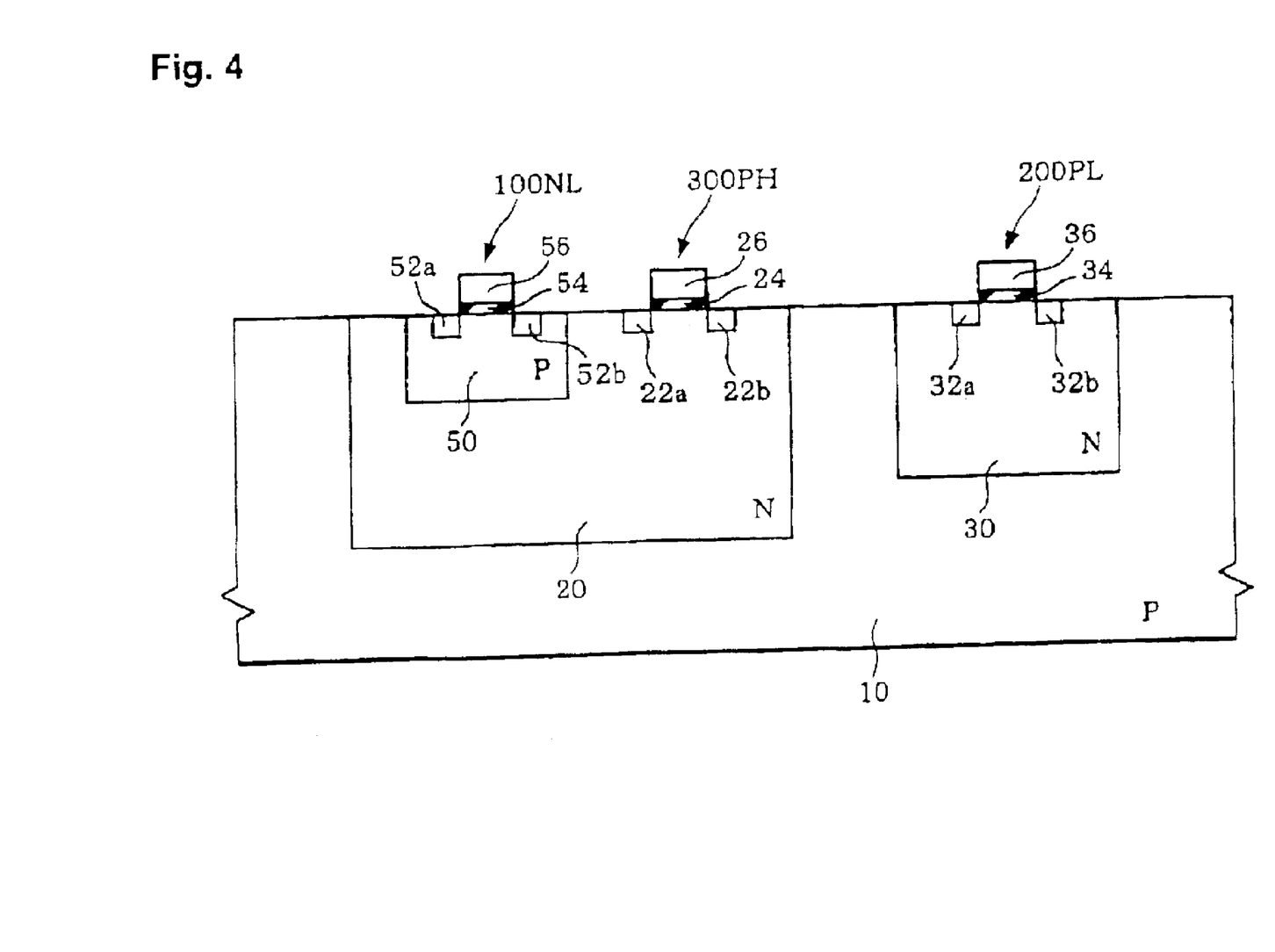
FIG. 4 shows a cross-sectional view indicating the method for manufacturing a semiconductor device in the process order in accordance with the first embodiment of the present invention.

(D) Turning to FIG. 4, element isolation dielectric layers (not shown), gate dielectric layers, gate electrodes and source/drain layers are formed by a known method to form specified transistors. More particularly, low breakdown voltage transistors are formed in the second well 30 and the third well 50, and a high breakdown voltage transistor is formed in the first well 20.

Even more specifically, a P-channel type low breakdown voltage transistor 200PL is formed in the second well 30. The low breakdown voltage transistor 200PL includes source/drain layers 32a and 32b that are composed of P-type impurity layers, a gate dielectric layer 34 and a gate electrode 36.

An N-channel type low breakdown voltage transistor 100NL is formed in the third well 50. The low breakdown voltage transistor 100NL includes source/drain layers 52a and 52b that are composed of N-type impurity layers, a gate dielectric layer 54 and a gate electrode 56.

A P-channel type high breakdown voltage transistor 300PH is formed in the first well 20. The high breakdown voltage transistor 300PH includes source/drain layers 22a and 22b that are composed of P-type impurity layers, a gate dielectric layer 24 and a gate electrode 26.

The low breakdown voltage transistors 100NL and 200PL are driven by a driving voltage of, for example, 1.8–5V. The high breakdown voltage transistor 300PH is driven by a substantially higher driving voltage compared to those of the low breakdown voltage transistors 100NL and 200PL, for example, by a driving voltage of 20–60V. A ratio of the breakdown voltages between the low breakdown voltage transistors and the high breakdown voltage transistor, i.e., (a breakdown voltage of a high breakdown voltage transistor)/(a breakdown voltage of a low breakdown voltage transistor) is, for example, 3–60. Here, the "breakdown voltage" generally means a drain breakdown voltage.

In the present embodiment, the structure of each of the wells is determined based on the breakdown voltage and threshold voltage of the transistors provided in each well and junction breakdown voltage and punch-through breakdown voltage between the wells.

Next, the impurity concentrations of the wells are described. The impurity concentration of the second well 30 and third well 50 where low breakdown voltage transistors are formed is set higher than the impurity concentration of the first well 20 where a high breakdown voltage transistor is formed. In this way, the impurity concentration of each well can be appropriately set according to the driving voltage and breakdown voltage of each transistor. The impurity concentration of the second well 30 and third well 50 is, for example, $4.0\times10^{16}$–$7.0\times10^{17}$ atoms/cm$^3$ in their surface concentration. The impurity concentration of the first well 20 is, for example, $8.0\times10^{15}$–$4.0\times10^{16}$ atoms/cm$^3$ in its surface concentration.

With respect to the well depth, in view of the well breakdown voltage, the second well 30 and the third well 50 where low breakdown voltage transistors are located are formed shallower than the first well 20 where a high breakdown voltage transistor is formed. For example, the first well 20 has a depth of 10–20 μm, and the second well 30 and the third well 50 have a depth of 3–10 μm. As the depth of the first well 20 is compared to the depth of the second well 30 and the third well 50, respectively, a depth ratio of the two is for example 2–5, respectively.

The transistors shown in FIG. 4 are isolated by element isolation dielectric layers (not shown). Each of the high breakdown voltage transistors may have a so-called offset gate structure in which its gate electrode does not overlap its source/drain layers. In the example described below, each high breakdown voltage transistor has a LOCOS offset structure. More specifically, in each of the high breakdown voltage transistors, an offset region is provided between a gate electrode and source/drain layers. The offset region is composed of a low concentration impurity layer below the offset LOCOS layer provided in a specified region of the semiconductor layer.

Figure 13:
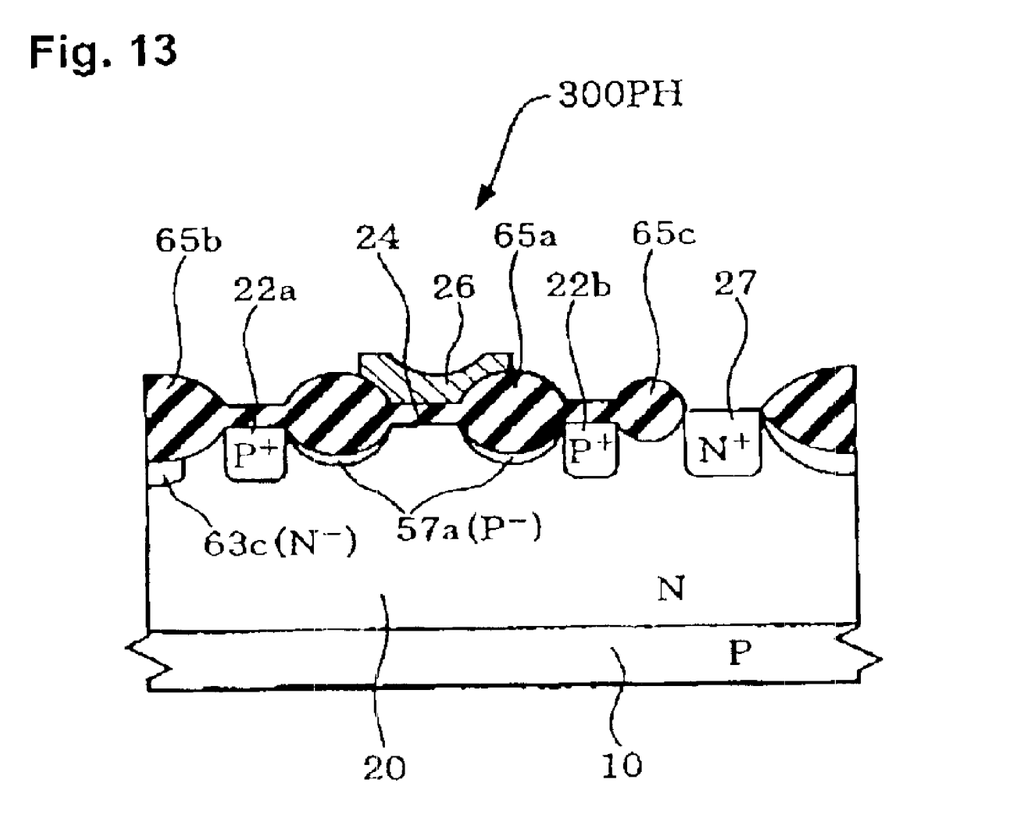
FIG. 13 shows a cross-sectional view of an exemplary structure of a high breakdown voltage transistor of a semiconductor device formed by a manufacturing method in accordance with an embodiment of the present invention.

FIG. 13 shows, as an example of the offset gate structure, a cross-sectional view of the structure of the high breakdown voltage transistor 300PH.

The P-channel type high breakdown voltage transistor 300PH includes a gate dielectric layer 24 provided over the N-type first well 20, a gate electrode 26 formed over the gate dielectric layer 24, an offset LOCOS layer 65a provided around the gate dielectric layer 24, an offset impurity layer 57a composed of a P-type low concentration impurity layer that is formed below the offset LOCOS layer 65a, and source/drain layers 22a and 22b provided on the outside of the offset LOCOS layer 65a.

The high breakdown voltage transistor 300PH and its adjacent transistor are electrically isolated from each other by an element isolation LOCOS layer (element isolation dielectric layer) 65b. Further, a channel stopper layer 63c composed of an N-type low concentration impurity layer is formed below the element isolation LOCOS layer 65b within the N-type first well 20 as shown in the drawing. A well contact layer 27 is isolated from the source/drain layer 22b by the LOCOS layer 65c. A channel stopper layer (not shown) can be formed below the LOCOS layer 65c.

Each of the high breakdown voltage transistors has a LOCOS offset structure and therefore has a high drain breakdown voltage, such that a high breakdown voltage MOSFET can be composed. In other words, by providing the offset impurity layer 57a composed of a low concentration impurity layer below the offset LOCOS layer 65a, the offset impurity layer 57a can be made relatively deep against the channel region, compared to a case without the offset LOCOS layer. As a result, when the transistor is in an OFF state, a deep depletion layer can be formed because of the offset impurity layer 57a, and a drain breakdown voltage can be increased as the electric field adjacent to the drain electrode is alleviated. Such an offset structure can be similarly applied to other embodiments.

Further, the third well 50 is formed within the first well 20, and therefore is electrically isolated from the semiconductor layer 10. As a result, a driving voltage can be set for the third well 50 independently of the substrate potential Vsub of the semiconductor layer 10.

By the manufacturing method in accordance with the present invention, the first well 20 where the high breakdown voltage transistor 300PH is formed, and the third and second wells 50 and 30 where the low breakdown voltage transistors 100NL and 200PL are located are formed through different ion implanting steps and drive-in steps by different heat processes. Therefore, the first well 20, the second well 30 and the third well 50 can be designed independently from one another. As a result, the design of each of the wells can be optimized for transistors to be formed therein. For example, wells where high breakdown voltage transistors are formed can reliable have a sufficient breakdown voltage. Also, wells where low breakdown voltage transistors are formed can be made shallow to accommodate size-reduction and the higher speed of low breakdown voltage transistors, and also can reduce the areas of the wells accordingly, such that the degree of integration of low breakdown voltage transistors can be increased.

2. Second Embodiment

FIGS. 5–8 schematically show cross-sectional views concerning a method for manufacturing a semiconductor device in accordance with a second embodiment of the present invention. The second embodiment is different from the first embodiment with respect to the impurity concentrations of the first well and second well, but their basic process is the same.

Figure 5:
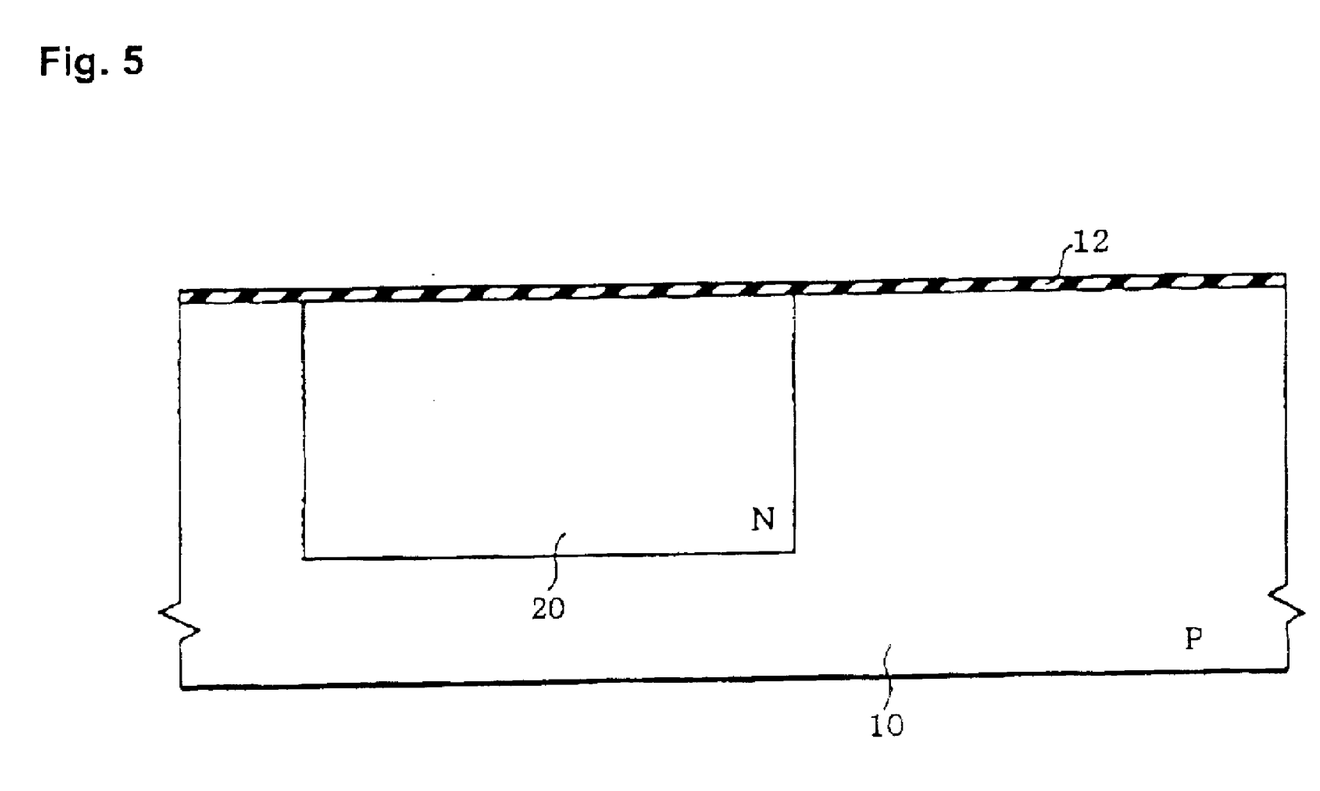
FIG. 5 shows a cross-sectional view indicating the method for manufacturing a semiconductor device in the process order in accordance with a second embodiment of the present invention.

(A) As shown in FIG. 5, like the first embodiment, a resist layer (not shown) is formed on the silicon oxide layer 12. The resist layer is patterned such that an opening section is formed therein at a position corresponding to an N-type first well. Then, for example, phosphorus ions are implanted in the semiconductor layer 10 using the resist layer as a mask to form an impurity layer (not shown) of a second conductivity type (N-type in this example). In this instance, phosphorus ions can be implanted at an acceleration voltage of 120 keV, for example. Then, the impurity in the N-type first impurity layer is diffused (driven in) by a thermal treatment, to form an N-type first well 20.

Figure 6:
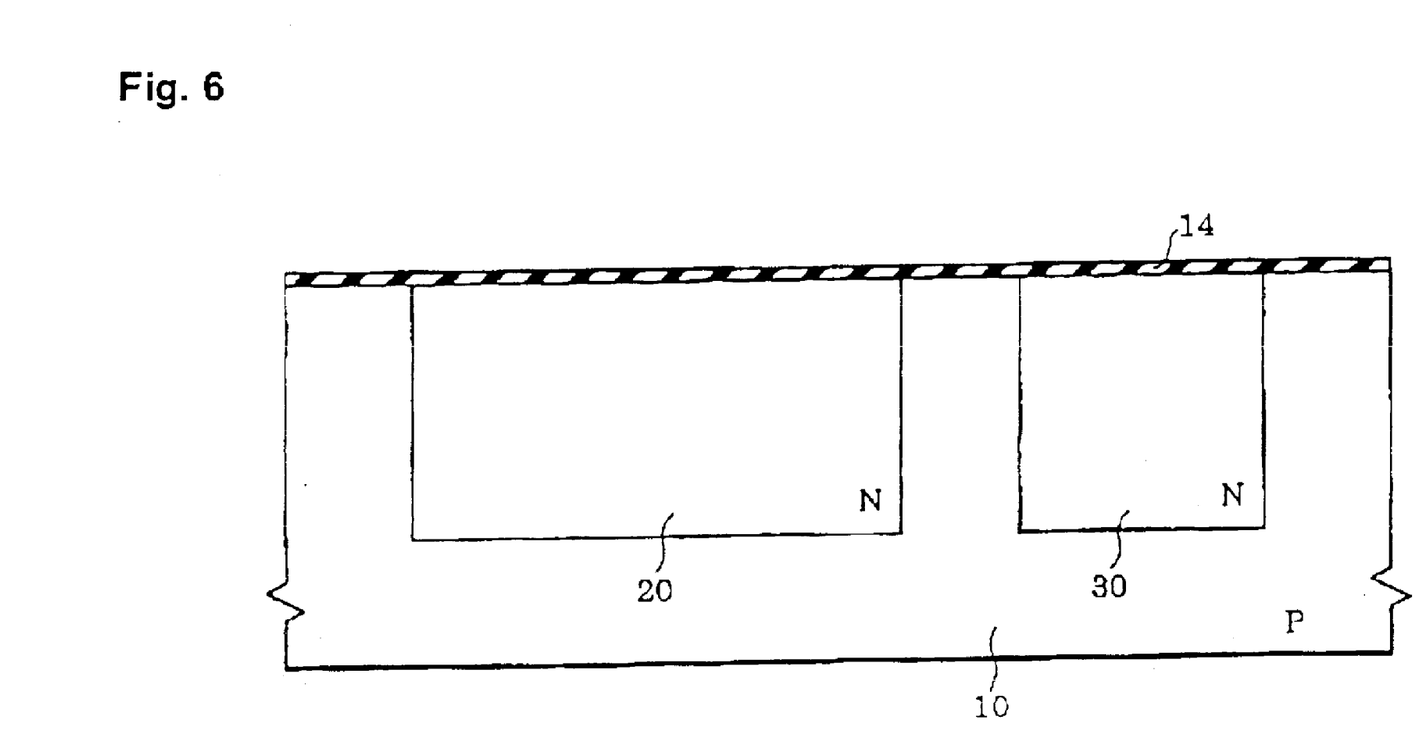
FIG. 6 shows a cross-sectional view indicating the method for manufacturing a semiconductor device in the process order in accordance with the second embodiment of the present invention.

(B) As shown in FIG. 6, like the first embodiment, a resist layer (not shown) is formed on the silicon oxide layer 14. The resist layer is patterned such that an opening section is formed therein at a position corresponding to an N-type second well. Then, for example, phosphorus ions are implanted in the semiconductor layer 10 using the resist layer as a mask to form an N-type impurity layer (not shown). In this instance, phosphorus ions can be implanted at an acceleration voltage of 120 keV, for example. Then, the impurity in the N-type first impurity layer is diffused (driven in) by a thermal treatment, to form an N-type second well 30.

Here, the impurity concentration of the first well 20 formed in step (A) is set lower than the impurity concentration of the second well 30 formed in step (B). This aspect will be described in detail later.

Figure 7:
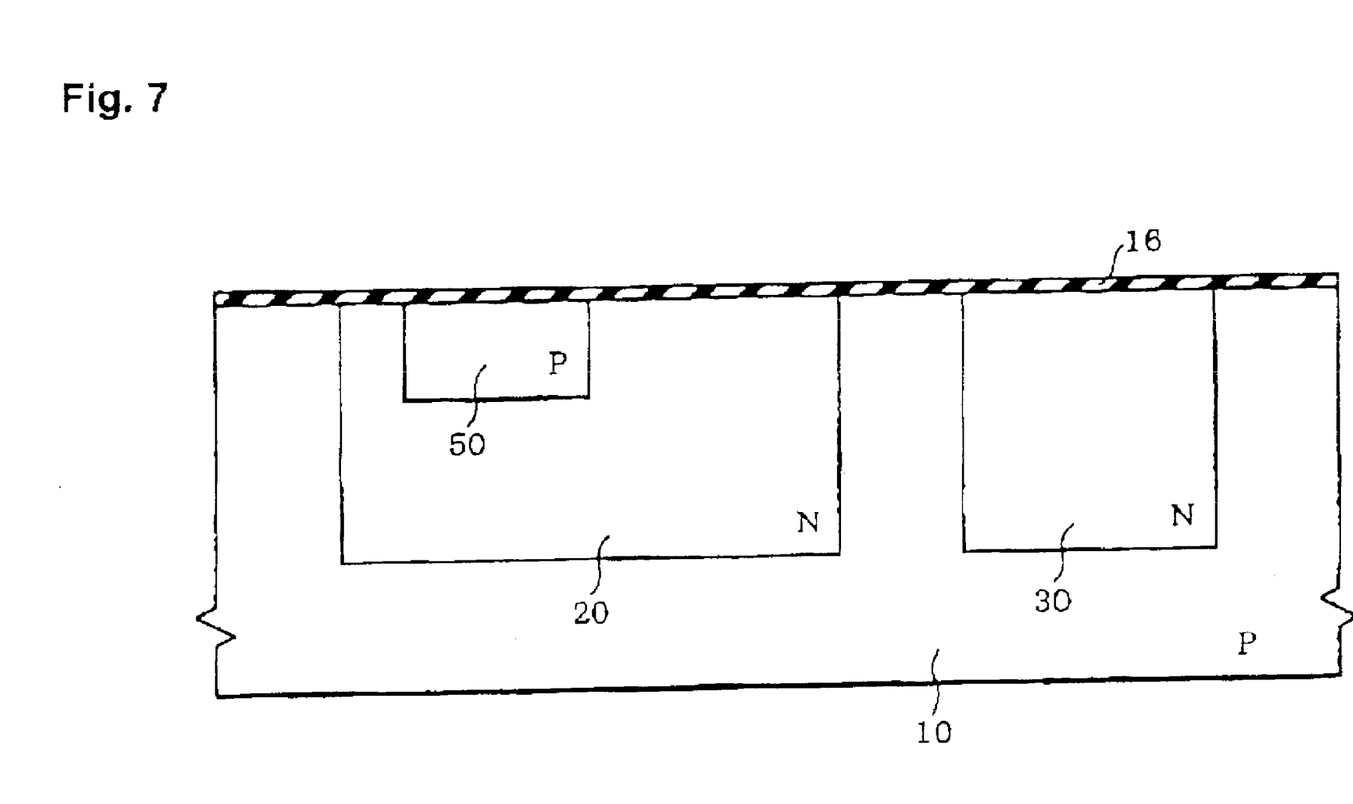
FIG. 7 shows a cross-sectional view indicating the method for manufacturing a semiconductor device in the process order in accordance with the second embodiment of the present invention.

(C) As shown in FIG. 7, like the first embodiment, a resist layer (not shown) having an opening section at a location corresponding to a third well is formed on the silicon oxide layer 16. Boron ions, for example, are implanted in a specified region of the N-type first well 20 using the resist layer as a mask, to form a P-type impurity layer. In this instance, boron ions can be implanted at an acceleration voltage of 60 keV, for example. Then, the impurity in the P-type impurity layer is diffused (driven in) by a thermal treatment, to form a P-type third well 50.

In this manner, the N-type first well 20, and the N-type second well 30 having an impurity concentration lower than that of the first well 20 are formed in the P-type semiconductor layer 10. Further, the P-type third well 50 is formed within the first well 20.

Figure 8:
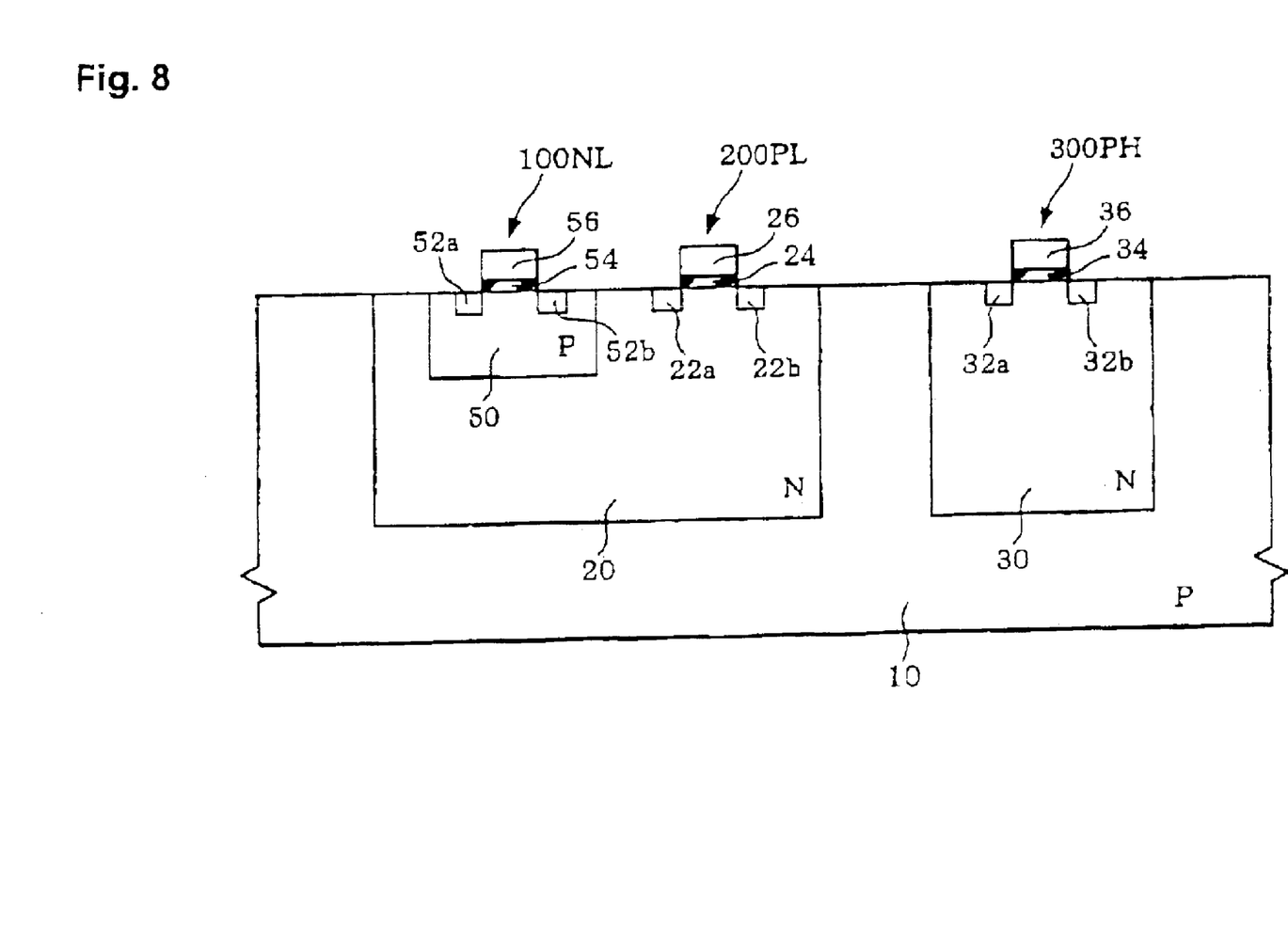
FIG. 8 shows a cross-sectional view indicating the method for manufacturing a semiconductor device in the process order in accordance with the second embodiment of the present invention.

(D) Turning to FIG. 8, element isolation dielectric layers (not shown), gate dielectric layers, gate electrodes and source/drain layers are formed by a known method to form specified transistors. More particularly, low breakdown voltage transistors are formed in the first well 20 and the third well 50, and a high breakdown voltage transistor is formed in the second well 30.

Even more specifically, a P-channel type high breakdown voltage transistor 300PH is formed in the second well 30. The high breakdown voltage transistor 300PH includes source/drain layers 32a and 32b that are composed of P-type impurity layers, a gate dielectric layer 34 and a gate electrode 36.

An N-channel type low breakdown voltage transistor 100NL is formed in the third well 50. The low breakdown voltage transistor 100NL includes source/drain layers 52a and 52b that are composed of N-type impurity layers, a gate dielectric layer 54 and a gate electrode 56.

A P-channel type low breakdown voltage transistor 200PL is formed in the first well 20. The low breakdown voltage transistor 200PL includes source/drain layers 22a and 22b that are composed of P-type impurity layers, a gate dielectric layer 24 and a gate electrode 26.

The low breakdown voltage transistors 100NL and 200PL are driven by a driving voltage of, for example, 1.8–5V. The high breakdown voltage transistor 300PH is driven by a substantially higher driving voltage compared to those of the low breakdown voltage transistors 100NL and 200PL, for example, by a driving voltage of 20–60V. A ratio of the breakdown voltages between the low breakdown voltage transistors and the high breakdown voltage transistor, i.e., (a breakdown voltage of a high breakdown voltage transistor)/(a breakdown voltage of a low breakdown voltage transistor) is, for example, 3–60. Here, the "breakdown voltage" generally means a drain breakdown voltage.

In the present embodiment, the structure of each of the wells is determined based on the breakdown voltage and threshold voltage of transistors provided in each well and junction breakdown voltage and punch-through breakdown voltage between the wells.

Next, the impurity concentrations of the wells are described. The impurity concentration of the first well 20 and third well 50 where low breakdown voltage transistors are formed is set higher than the impurity concentration of the second well 30 where a high breakdown voltage transistor is formed. In this way, the impurity concentration of each well can be appropriately set according to the driving voltage and breakdown voltage of each transistor. The impurity concentration of the first well 20 and third well 50 is, for example, $4.0 \times 10^{16} – 7.0 \times 10^{17}$ atoms/cm$^3$ in their surface concentration. The impurity concentration of the second well 30 is, for example, $8.0 \times 10^{15} – 4.0 \times 10^{16}$ atoms/cm$^3$ in its surface concentration.

With respect to the well depth, in view of the well breakdown voltage, the third well 50 where a low breakdown voltage transistor is formed is made shallower than the second well 30 where a high breakdown voltage transistor is formed. For example, the second well 30 has a depth of 10–20 μm, and the third well 50 has a depth of 3–10 μm. As the depth of the second well 30 is compared to the depth of the third well 50, a depth ratio of the two is for example 2–5.

The transistors shown in FIG. 8 are isolated by element isolation dielectric layers (not shown). Each of the high breakdown voltage transistors may have a so-called offset gate structure in which its gate electrode does not overlap its source/drain layers. The offset gate structure is the same as that of the first embodiment, and therefore is not described here.

Further, the third well 50 is formed within the first well 20, and therefore is electrically isolated from the semiconductor layer 10. As a result, a driving voltage can be set for the third well 50 independently of the substrate potential Vsub of the semiconductor layer 10.

By the manufacturing method in accordance with the present invention, the second well 30 where the high breakdown voltage transistor 300PH is formed, and the third and first wells 50 and 20 where the low breakdown voltage transistors 100NL and 200PL are located are formed through different ion implanting steps and drive-in steps by different heat processes. Therefore, the first well 20, the second well 30 and the third well 50 can be designed independently from one another. As a result, the design of each of the wells can be optimized for the transistors to be formed therein. For example, wells where high breakdown voltage transistors are formed can reliably have a sufficient breakdown voltage. Also, wells where low breakdown voltage transistors are formed can be made shallow to accommodate size-reduction and the higher speed of low breakdown voltage transistors, and also can reduce the areas of the wells accordingly, such that the degree of integration of low breakdown voltage transistors can be increased.

In the present embodiment, the heat treatment that is performed in step (A) can be conducted together with the heat treatment that is performed in step (B), and the first well 20 and the second well 30 can be simultaneously formed.

3. Third Embodiment

FIGS. 9–12 schematically show cross-sectional views concerning a method for manufacturing a semiconductor device in accordance with a third embodiment of the present invention. The third embodiment is different from the first and second embodiments in that it has more types of wells, but their basic process is the same. Portions in FIGS. 9–12 that are substantially the same as those shown in FIGS. 1–4 are assigned the same reference numerals, and their detailed description is omitted.

Figure 9:
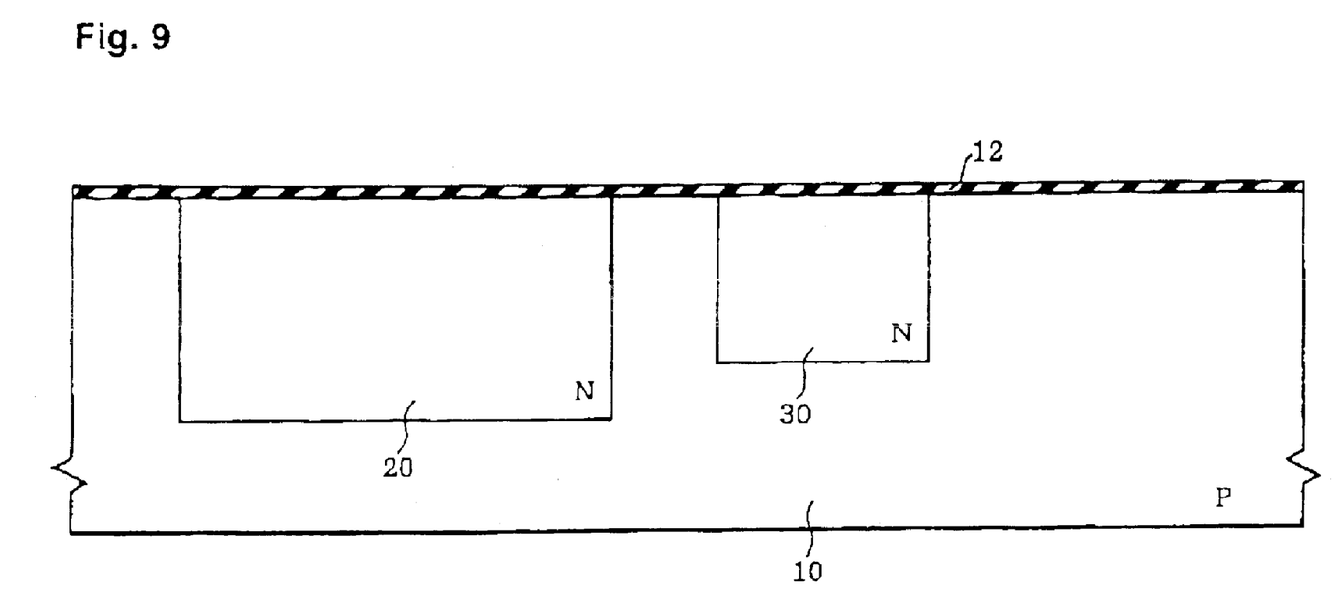
FIG. 9 shows a cross-sectional view indicating the method for manufacturing a semiconductor device in the process order in accordance with a third embodiment of the present invention.

(A) As shown in FIG. 9, like the first and second embodiments, N-type first well 20 and second well 30 are formed at specified regions of the semiconductor layer 10 by ion implanting and heat treatment.

Figure 10:
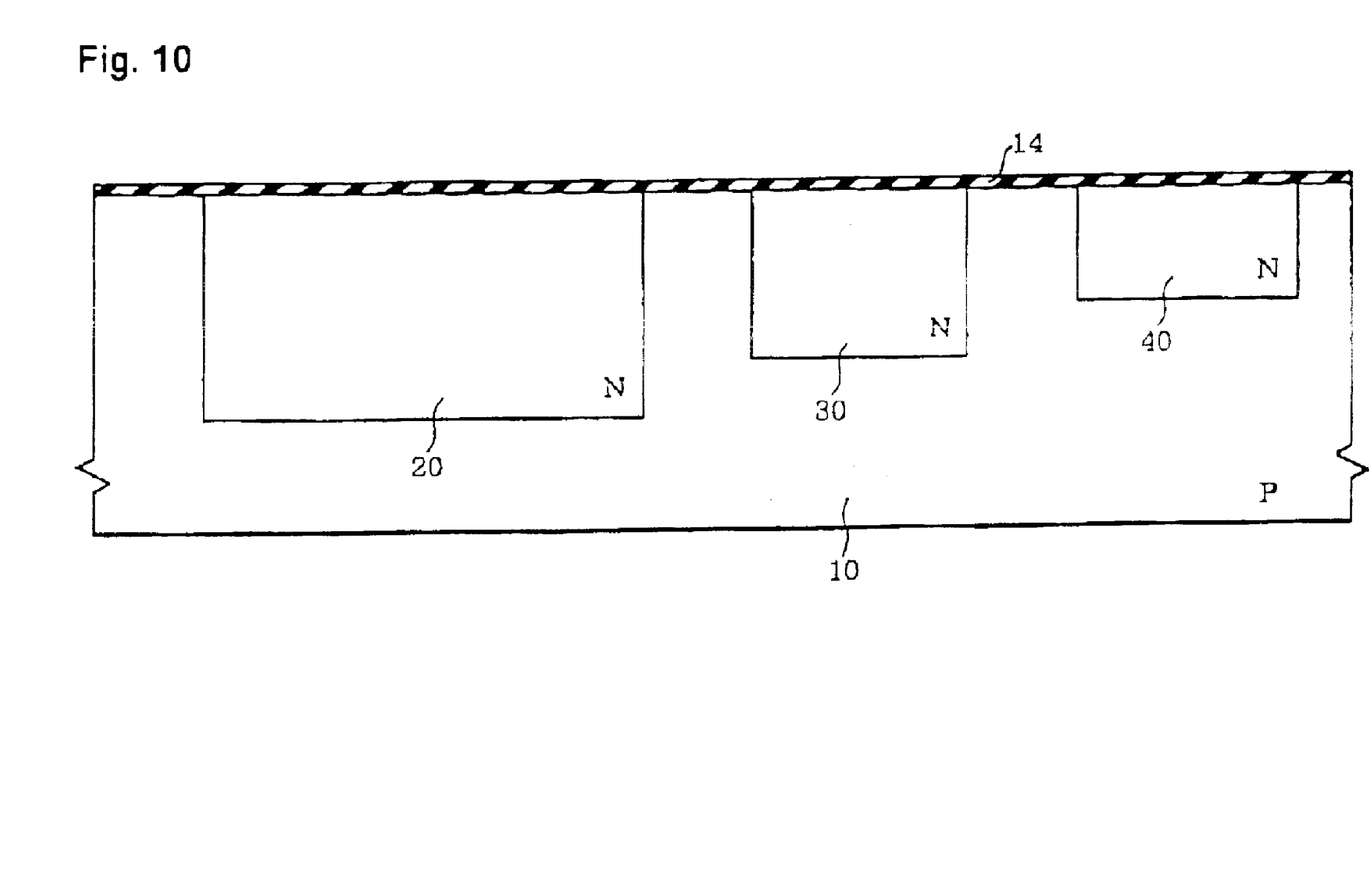
FIG. 10 shows a cross-sectional view indicating the method for manufacturing a semiconductor device in the process order in accordance with the third embodiment of the present invention.

(B) As shown in FIG. 10, an N-type fourth well 40 is formed in a specified region of the semiconductor layer 10 by ion implanting and heat treatment. More specifically, a resist layer (not shown) is formed on the silicon oxide layer 14. The resist layer is patterned such that an opening section is formed therein at a position corresponding to the N-type fourth well. Then, for example, phosphorus ions are implanted in the semiconductor layer 10 using the resist layer as a mask to form an N-type impurity layer (not shown). In this instance, phosphorus ions can be implanted at an acceleration voltage of 60 keV, for example. Then, the impurity in the N-type first impurity layer is diffused (driven in) by a thermal treatment, to form the N-type fourth well 40.

In this example, the impurity concentration of the first well 20 and the fourth well 40 is set higher than the impurity concentration of the second well 30. This aspect will be described in detail later.

Figure 11:
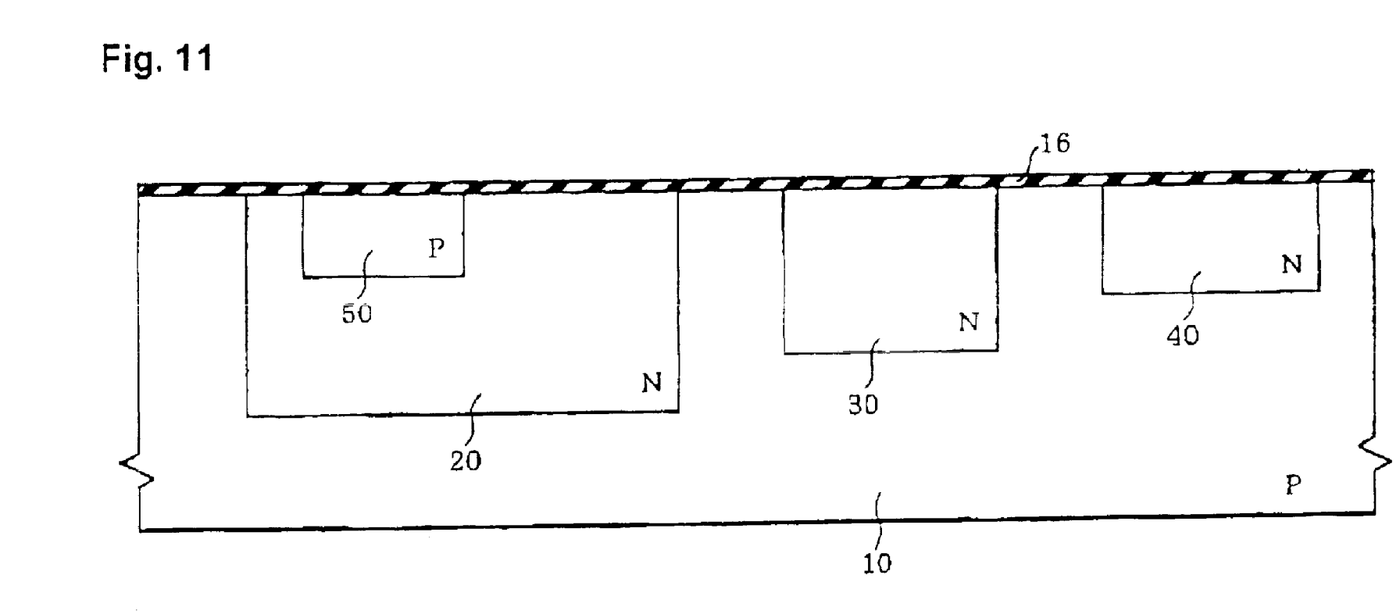
FIG. 11 shows a cross-sectional view indicating the method for manufacturing a semiconductor device in the process order in accordance with the third embodiment of the present invention.

(C) As shown in FIG. 11, like the first and second embodiments, a P-type third well 50 is formed in a specified region of the N-type first well 20 by ion implanting and heat treatment.

In this manner, the N-type first well 20, the N-type second well 30 having an impurity concentration lower than that of the first well 20, and the N-type fourth well 40 having an impurity concentration higher than that of the second well 30 are formed in P-type semiconductor layer 10. Further, the P-type third well 50 is formed within the first well 20.

Figure 12:
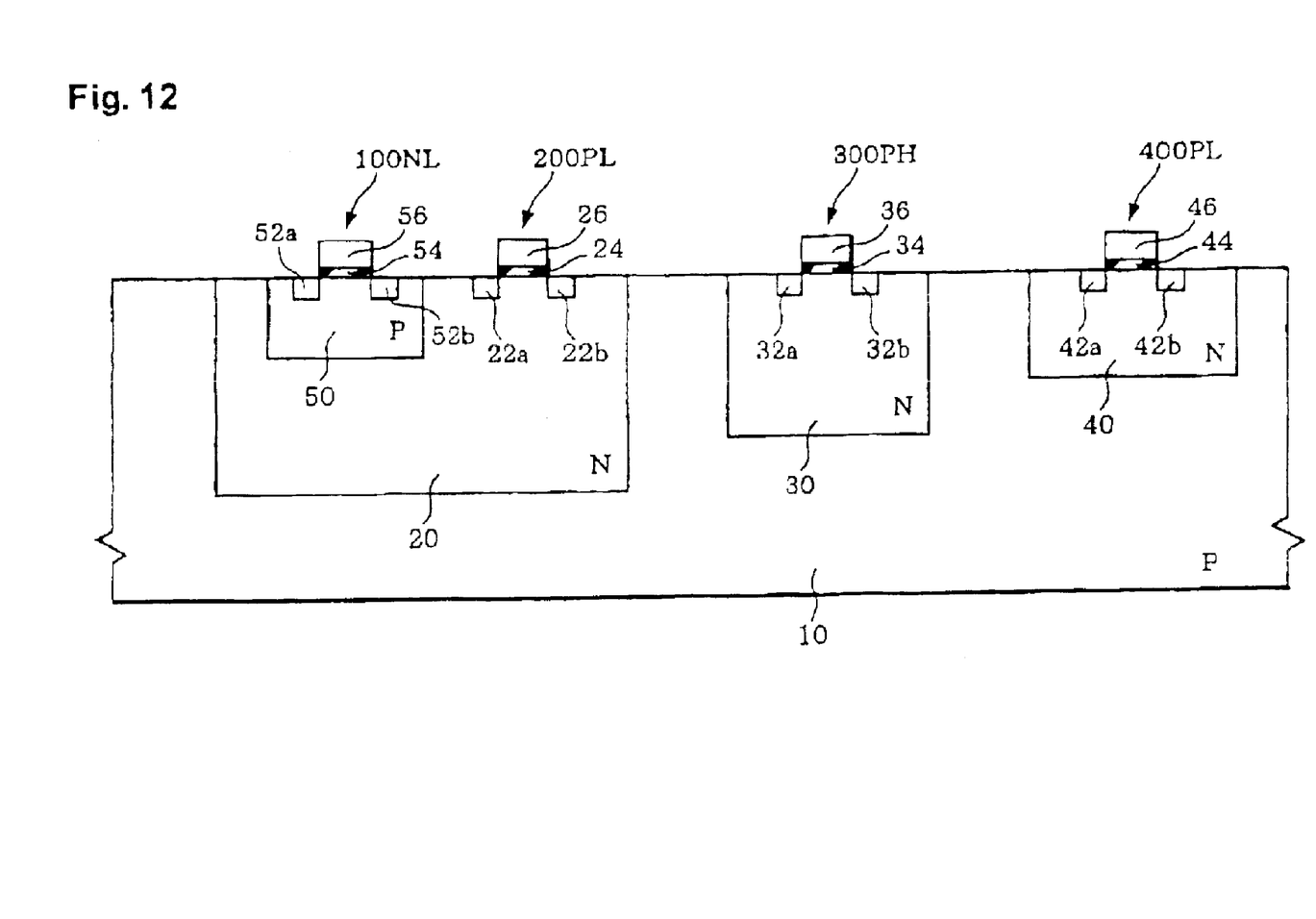
FIG. 12 shows a cross-sectional view indicating the method for manufacturing a semiconductor device in the process order in accordance with the third embodiment of the present invention.

(D) Turning to FIG. 12, element isolation dielectric layers (not shown), gate dielectric layers, gate electrodes and source/drain layers are formed by a known method to form specified transistors. More particularly, low breakdown voltage transistors are formed in the first well 20, the third well 50 and the fourth well 40, and a high breakdown voltage transistor is formed in the second well 30.

Even more specifically, a P-channel type high breakdown voltage transistor 300PH is formed in the second well 30. The high breakdown voltage transistor 300PH includes source/drain layers 32a and 32b that are composed of P-type impurity layers, a gate dielectric layer 34 and a gate electrode 36.

An N-channel type low breakdown voltage transistor 100NL is formed in the third well 50. The low breakdown voltage transistor 100NL includes source/drain layers 52a and 52b that are composed of N-type impurity layers, a gate dielectric layer 54 and a gate electrode 56.

A P-channel type low breakdown voltage transistor 200PL is formed in the first well 20. The low breakdown voltage transistor 200PL includes source/drain layers 22a and 22b that are composed of P-type impurity layers, a gate dielectric layer 24 and a gate electrode 26.

A P-channel type low breakdown voltage transistor 400PL is formed in the fourth well 40. The low breakdown voltage transistor 400PL includes source/drain layers 42a and 42b that are composed of P-type impurity layers, a gate dielectric layer 44 and a gate electrode 46.

The low breakdown voltage transistors 100NL, 200PL and 400PL are driven by a driving voltage of, for example, 1.8–5V. The high breakdown voltage transistor 300PH is driven by a substantially higher driving voltage compared to those of the low breakdown voltage transistors 100NL, 200PL and 400PL for example, by a driving voltage of 20–60V. A ratio of the breakdown voltages between the low breakdown voltage transistors and the high breakdown voltage transistor, ie., (a breakdown voltage of a high breakdown voltage transistor)/(a breakdown voltage of a low breakdown voltage transistor) is, for example, 3–60. Here, the "breakdown voltage" generally means a drain breakdown voltage.

In the present embodiment, the structure of each of the wells is determined based on the breakdown voltage and threshold voltage of transistors provided in each well and junction breakdown voltage and punch-through breakdown voltage between the wells.

Next, the impurity concentrations of the wells are described. The impurity concentration of the first well 20, the third well 50 and the fourth well 40 where low breakdown voltage transistors are formed is set higher than the impurity concentration of the second well 30 where a higher breakdown voltage transistor is formed. In this way, the impurity concentration of each well can be appropriately set according to the driving voltage and breakdown voltage of each transistor. The impurity concentration of the first well 20, the third well 50 and the fourth well 40 is, for example, $4.0 \times 10^{16}$–$7.0 \times 10^{17}$ atoms/cm$^3$ in their surface concentration. The impurity concentration of the second well 30 is, for example, $8.0 \times 10^{15}$–$4.0 \times 10^{16}$ atoms/cm$^3$ in its surface concentration.

With respect to the well depth, in view of the well breakdown voltage, the third well 50 and the fourth well 40 where low breakdown voltage transistors are located are formed shallower than the second well 30 where a high breakdown voltage transistor is formed. For example, the second well 30 has a depth of 10–20 $\mu$m, and the third well 50 and the fourth well 40 have a depth of 3–10 $\mu$m. As the depth of the second well 30 is compared to the depth of the third well 50 and the fourth well 40, respectively, a depth ratio of the two is for example 2–5, respectively.

The transistors shown in FIG. 12 are isolated by element isolation dielectric layers (not shown). Each of the high breakdown voltage transistors may have a so-called offset gate structure in which its gate electrode does not overlap its source/drain layers. Since the offset gate structure is the same as that of the first embodiment, it is not described here.

Also, the third well 50 is formed within the first well 20, and therefore is electrically isolated from the semiconductor layer 10. As a result, a driving voltage can be set for the third well 50 independently of the substrate potential Vsub of the semiconductor layer 10.

By the manufacturing method in accordance with the present invention, the second well 30 where the high breakdown voltage transistor 300PH is formed, and the third and first wells 50 and 20 where the low breakdown voltage transistors 100NL and 200PL are located are formed through different ion implanting steps and drive-in steps by different heat processes. Therefore, the first well 20, the second well 30, the third well 50 and the fourth well 40 can be designed independently from one another. As a result, the design of each of the wells can be optimized for the transistors to be formed therein. For example, wells where high breakdown voltage. Also, wells where are formed can reliably have a sufficient breakdown voltage. Also, wells where low breakdown voltage transistors are formed can be made shallow to accommodate size-reduction and the higher speed of low breakdown voltage transistors, and also can reduce the areas of the wells accordingly, such that the degree of integration of low breakdown voltage transistors can be increased.

In accordance with the present embodiment, the same heat treatment may be conducted to drive in impurities to thereby simultaneously form the first well 20 and the second well 30.

Also, in accordance with the present embodiment, by appropriately setting the impurity concentration of the first well 20, a high breakdown voltage transistor can also be formed in the first well 20.

The present invention is not limited to the embodiments described above, and many modifications can be made within the scope of the subject matter of the present invention. For example, the embodiments described above show examples in which the first conductivity type is P-type and the second conductivity type is N-type. However, these conductivity types may be reversed if desired. Also, the layer structure or plan structure of the semiconductor device can be different from those of the embodiments described above depending on device design.

The entire disclosure of Japanese Patent Application No. 2002-085575 filed Mar. 26, 2002 is incorporated by reference.

What is claimed is:

1. A method for manufacturing a semiconductor device, the method comprising:

implanting an impurity of a second conductivity type in a specified region of a semiconductor layer of a first conductivity type to form a first well;

implanting an impurity of the second conductivity type in a specified region of the semiconductor layer to form a second well that is shallower than the first well and having an impurity concentration different from the first well;

implanting an impurity of the first conductivity type in a specified region of the first well to form a third well; and implanting an impurity of the second conductivity type in a specified region of the semiconductor layer to form a fourth well having an impurity concentration different from the first well and the second well.

2. A method for manufacturing a semiconductor device according to claim 1, wherein an impurity concentration of the second well is made higher than an impurity concentration of the first well.

3. A method for manufacturing a semiconductor device according to claim 2, further comprising:

forming a low breakdown voltage transistor of the first conductivity type in the second well;

forming a low breakdown voltage transistor of the second conductivity type in the third well; and forming a high breakdown voltage transistor of the first conductivity type in the first well.

4. A method for manufacturing a semiconductor device according to claim 1, wherein an impurity concentration of the second well is made lower than an impurity concentration of the first well.

5. A method for manufacturing a semiconductor device according to claim 4, further comprising:

forming a low breakdown voltage transistor of the first conductivity type in the first well;

forming a low breakdown voltage transistor of the second conductivity type in the third well; and forming a high breakdown voltage transistor of the first conductivity type in the second well.

6. A method for manufacturing a semiconductor device according to claim 1, further comprising:

forming a low breakdown voltage transistor of the second conductivity type in the third well;

forming a low breakdown voltage transistor of the first conductivity type in the fourth well;

forming a high breakdown voltage transistor of the first conductivity type in the second well; and forming a low breakdown voltage transistor or high breakdown voltage transistor of the first conductivity type in the first well.

* * * * *